METHOD OF MAKING CIRCUIT COMPONENTS

Filed Feb. 26, 1962

INVENTOR
IRVING RUSSELL BOGUE
FRANCIS MELVIN PASBORG

BY Lindsey, Prutzman and Hayes
ATTORNEYS

United States Patent Office 3,131,103

Patented Apr. 28, 1964

3,131,103

METHOD OF MAKING CIRCUIT COMPONENTS

Irving Russell Bogue, East Windsor, and Francis Melvin Pasborg, Wethersfield, Conn., assignors to The J. M. Ney Company, Bloomfield, Conn., a corporation of Connecticut Filed Feb. 26, 1962, Ser. No. 175,428
7 Claims. (Cl. 156—3)

The present invention relates to circuit components having an electrically conductive metal element, and more particularly to circuit components having an electrically conductive element or pattern of noble metal and to the method for their manufacture.

Circuit components using electrically conductive metal patterns therein have been widely employed in various types of electrical and electronic apparatus and have been commonly referred to as "printed circuit boards." For most applications, conductive metal patterns formed from base metals such as copper have been satisfactory. However, for sensitive applications wherein electrical current is carried and/or switched between two conductive elements with relative motion therebetween as in electrical telemetering devices, electrical analog to digital converters and encoders, base metals have proven generally unsatisfactory due to oxidation of the surface of the metal during storage and operation, unreliability of performance under varying conditions of atmosphere and temperature and excessive electrical "noise" produced by fluctuating contact resistance.

In an effort to produce satisfactory circuit components, the practice of electroplating noble metals or their alloys onto a previously formed base metal pattern has been commonly employed. These electroplated components have certain objectionable features in that the flexibility in alloy composition provided by wrought alloys is not obtainable so as to obtain a combination of optimum hardness and other properties. Additionally, there is a tendency for the noble metal deposit to be contaminated by cations and salts from the plating solution or by migration thereinto of the base metal upon which it is plated. Moreover, the electroplating process tends to produce some loss in accuracy in pattern and line definition as the result of any irregularities in the base metal, and the resultant surface of the plated deposit is generally not as uniform as desired. Despite these objectionable characteristics, electroplated noble metal circuit components have enjoyed extensive usage due to the greatly superior properties of the noble metal for precision applications.

It is an object of the present invention to provide circuit components having an electrically conductive element or pattern of wrought noble metal alloy therein which have superior properties of corrosion resistance, hardness and uniformity of thickness.

It is also an object to provide such a circuit component which is readily manufactured with precision accuracy from wrought noble metal alloy foil to provide a homogeneous conductive pattern.

Another object is to provide such circuit components having noble metal alloy elements of greater thickness and complexity than heretofore considered practicable.

A specific object is to provide a superior circuit component having a homogeneous wrought noble metal pattern therein for use in applications wherein current is carried and/or switched between two components with relative motion therebetween and which is characterized by superior properties of freedom from fluctuation in contact resistance, hardness, stability and dimensional accuracy.

A further object is to provide a method for making circuit components having a homogeneous conductive metal element or pattern therein from wrought noble metal alloys which method is characterized by facility in operation, ease of dimensional control and uniformity of result.

A still further object is to provide a method for making circuit components having a conductive metal pattern therein from wrought noble metal alloy foil wherein the procedure may be varied readily to permit versatility in application.

Yet another object is to provide a facile and reliable method for providing solid bubble- and gas-free synthetic plastic filling or flushing in the recessed portions of a circuit component having a metal pattern therein.

Other objects will be in part obvious and in part pointed out more in detail hereinafter.

The invention accordingly consists in the features of construction, combination of elements and arrangement of parts which will be exemplified in the construction hereafter set forth and the scope of the application which will be indicated in the appended claims.

Figures 1, 2, 6:
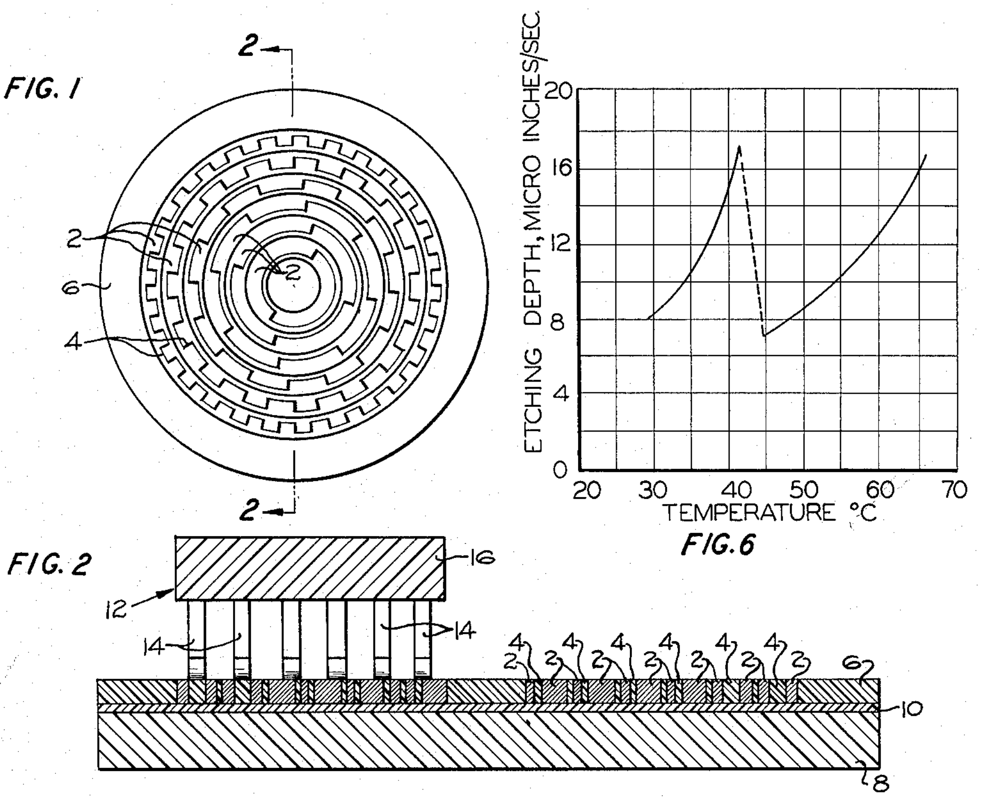
FIG. 1 is a plan view on an enlarged scale of a commutator embodying the present invention.
FIG. 2 is a further enlarged sectional view along the line 2—2 of FIG. 1 and showing a fragmentary illustrated brush assembly cooperating therewith.
FIG. 6 is a graph showing the effect of temperature upon rate of etch for the preferred etchant formulation.

It has now been found that the foregoing and related objects can be attained by a method in which a foil of noble metal alloy containing essentially 60.0 to 75.0 percent by weight gold, 5.0 to 15.0 percent by weight of second noble metal component selected from the group consisting of platinum and of palladium and platinum and providing at least 3.0 percent by weight platinum in the alloy, 10.0 to 20.0 percent by weight copper, up to 10.0 percent by weight silver and up to 3.0 percent by weight zinc is provided with a resist pattern upon at least one surface and then etched in an acid bath containing 2.8 to 5.8 mols per liter of nitric acid and 3.5 to 6.5 mols per liter of hydrochloric acid at a temperature of about 20 to 80° centigrade for a period of time sufficient to etch the foil unprotected by said resist pattern. The foil may be mounted or laminated upon one face of an acid-resistant backing member prior to the etching operation or it may be coated upon the second surface with a matching resist pattern to etch through the thickness of the foil from both sides or it may be completely coated upon its second surface with an acid-resistant material to prevent attack thereon, the particular procedure selected depending upon the intended application and the thickness of the foil. If so desired, foils may be mounted upon both surfaces of a backing member, provided with the desired resist patterns, and simultaneously etched to provide a double-sided conductive pattern component.

In the method of the present invention, the component has a backing member upon which the foil or foils are mounted so as to provide the desired strength to the components. The foil is electrically insulated from or by the backing member, although in dual conductive pattern components, electrical connection between the two patterns may be provided through the backing member. In the etched-out portions of the foil, synthetic resin may be utilized as a flushing agent to provide a substantially coplanar surface with respect to the foil pattern.

More particularly, the wrought noble metal foil utilized for the present invention is of substantially uniform thickness of about 1 to 10 mils and is substantially free from dimples or other surface imperfections. One mil in thickness is a practical lower limit for the foil due to the difficulties in rolling flat, dimple-free material and in some procedures to accommodate the subsequent machining or polishing of the surface of the mounted foil pattern. Ten mils in thickness is a practical upper limit for the foil due to the problems in maintaining dimensional accuracy and line stability during the progress of the etching (undercutting).

The alloys used in the present invention desirably contain zinc in an amount of up to 3.0 percent by weight and preferably about 0.5 to 2.0 percent by weight to act as a scavenger or deoxidant for the alloy while also providing some enhancement for the hardness of the alloy. The alloys also desirably contain silver to reduce the amount of gold in the alloy and thereby the copper content due to the necessity for maintaining about a weight ratio of about 5–6:1 therebetween for proper age hardening characteristics. Amounts up to 10.0 percent by weight silver may be employed for this purpose and about 3.0 to 8.0 percent by weight is preferred.

The preferred alloys of the present invention contain essentially 70.0 to 73.0 percent by weight gold, 7.0 to 10.0 percent by weight platinum or platinum-palladium, 13.0 to 16.0 percent by weight copper, up to 2.0 percent by weight zinc and up to 8.0 percent by weight silver. Because of the aforesaid advantages in using zinc and silver, they are most desirably included in the above composition within the range of 0.5 to 2.0 percent by weight and 3.0 to 8.0 percent by weight, respectively.

The following is a specific example of an alloy formulation which has been found especially effective for the purposes of the present invention:

| | Percent by weight |
|---|---|
| Gold | 71.5 |
| Platinum | 8.5 |
| Silver | 4.5 |
| Copper | 14.5 |
| Zinc | 1.0 |

The work-hardening of the alloy foil occurring during cold-rolling is most desirably augmented by subjecting the foil to a low-temperature age-hardening treatment at about 850 to 900° Fahrenheit. In order to maintain optimum properties of the wrought metal foil in the final product, the foil should not be subjected to temperatures above the annealing temperature of about 1200° Fahrenheit.

The acid bath of the present invention is one quite critical in composition for optimum etching of the wrought noble alloy foils of the present invention. Although acid baths using a range of composition of 2.8 to 5.8 mols per liter of nitric acid and 3.5 to 6.5 mols per liter of hydrochloric acid have been employed satisfactorily, the preferred baths utilize a mixture of 4.5 to 5.5 mols per liter of hydrochloric acid and 3.8 to 4.8 mols per liter of nitric acid for optimum speed and control of the etching operation. Variation from the broad compositional limits defined above will result in significant reduction of the rate of etch and also tend to result in loss of optimum line definition. With baths of the preferred composition range, it has been found that etching times of less than four minutes are sufficient to completely etch through foils three mils in thickness from one side at a temperature of about 35 to 55° centigrade.

As will be readily appreciated, the temperature of the bath tends to influence the rate of attack upon the metal. The baths of the present invention are utilized at a temperature of between 20 and 80° centigrade, temperatures below 20° centigrade producing an extremely slow rate of etch upon the metal. At temperatures above 80° centigrade, the bath itself tends to decompose and efficient control of the etching reaction is not possible.

In the practice of the present invention, it has been noted that variation in temperature produces a surprising effect in that an unusual phenomenon takes place at temperatures of about 35 to 55° centigrade. More particularly, the rate of etch climbs with increasing temperature and then drops precipitously from a high point to a very low rate as illustrated in FIG. 6 of the attached drawings, after which it begins to rise again. Although the phenomenon is not fully understood, it is believed that this abrupt change in reaction rate is occasioned by a passivation effect occurring at or near the surface of the noble metal alloy, possibly due to the formation of complex ions or compounds. Because of this phenomenon, the preferred temperature for the performance of the etching operation of the present invention is at or slightly below the first peak in the temperature-reaction rate curve. Because of the high rate of etch at this relatively low temperature, the process may be conducted rapidly with a minimum of fume evolution as compared with an equivalent rate occurring from a temperature on the second rise of the reaction rate curve.

The curve and passivation effect point shift with variations in the precise formulation of the etching bath and may be determined conveniently by observing weight loss of specimens immersed in the bath at various temperatures. FIG. 6 is the curve determined for the acid bath formulation found especially effective for the present invention. This bath contains about 5.0 mols per liter of hydrochloric acid and 4.3 mols per liter of nitric acid and is utilized for optimum effectiveness at or slightly below the first peak of the reaction rate curve; i.e., 39 to 42° centigrade.

For most applications, the etching will be allowed to progress for a period of time sufficient to remove the entire thickness of the foil at the unprotected areas. However, for some applications such as switches, the etching may be terminated after removal of only part of the thickness and the flushing agent used to provide a nonconductive surface between the unetched metal pattern areas.

Although the foil may be immersed in the etching bath without having been mounted on a support or backing member, it is generally preferable to support the foil upon one side either by a permanent or a temporary backing formed of a material which is resistant to the etching bath. If so desired, a temporary backing may be provided by applying the resist material uniformly over the surface of the foil which is not to be etched. However, for some applications, it may be desirable to etch the foil upon both surfaces simultaneously, particularly in the instance of heavier foils. For such applications, the alignment of the two resist patterns must be closely controlled.

The backing members used in the circuit components of the present invention may be fabricated from synthetic plastic, ceramic material or metal depending upon the application for which the circuit component is intended and should provide a support of sufficient strength to protect the metal pattern from injury and distortion under operating conditions. If metal is employed, the adhesive layer for bonding the foil thereto may be sufficient in thickness and dielectric properties to insulate the conductive metal pattern therefrom, although for some applications, it may be desirable to provide electrical interconnection. Synthetic plastic backing members, which term includes plastic-impregnated cloths and papers for the purposes of the present invention, have proven particularly effective for circuit components of this type because of their dielectric properties, ease of fabrication to desired configuration and facility of bonding to the metal foil. The synthetic plastics are preferably reinforced for greater strength as by the inclusion of glass, mineral or ceramic fibers. Plastic-impregnated glass cloth and plastic-impregnated paper laminates have proven quite effective for providing high-strength backing members.

Although the synthetic plastic may be of thermoplastic nature, thermosetting plastics have been found preferable for the present invention because of their generally superior dielectric and physical properties and the relative ease with which adherence may be effected to the foil or adhesive interlayer and to a separate flushing agent when such is employed. Specific examples of suitable backing materials are glass-filled epoxy resins, glass-filled melamine resins, glass-filled phenolic resins, and laminates of glass cloth or paper impregnated with melamine or phenolic resins.

The thickness of the backing member will depend largely upon the intended application and the particular process of manufacture. Generally, the thickness should be sufficient to ensure proper support for the foil and adequate strength in the finished circuit component. Backing members of about 1/64 to 1 inch have been satisfactorily utilized and thicknesses of 1/16 to 1/4 inch will generally be sufficient for most components.

Although in some applications, the plastic backing may be bonded directly to the metal foil by application of heat and pressure, it has been found generally desirable to utilize an intermediate layer of adhesive for optimum bonding and maximum peel strength. As previously stated, the adhesive layer may also serve as an insulating layer between the conductive metal pattern and a metallic backing member.

Although thermoplastic resin adhesive agents may be employed for this purpose, thermosetting resin adhesive agents are generally preferred because of their superior properties for electrical applications and generally superior bonding characteristics to the metal foil and to the backing material. Among the adhesive agents which may be employed are epoxies, isocyanates, phenolic-elastomers and phenolic-epoxies. Nitrile-phenolics have proven particularly advantageous in the practice of the present invention.

The adhesive may be applied either as a preformed film or as a semi-fluid lacquer with the solvent being allowed to evaporate prior to the bonding operation. The foil is laminated to the backing material under heat and pressure according to conventional practice. Generally, a temperature of 250 to 500° Fahrenheit and pressure of 350 to 1800 p.s.i. is sufficient for the laminating operation at times of one-half to two and one-half hours. Generally, the adhesive film is utilized in a thickness of about 1 to 10 mils, and preferably about 3 to 7 mils for most applications. However, for certain applications, it may be desired to utilize the adhesive layer as the flushing agent for the etched-out portions in the metal pattern. In such an instance, an adhesive film of greater thickness may be desirable so as to provide sufficient material for filling the etched-out portions of the foil upon application of heat and pressure.

Although the resist pattern may be silk-screened or otherwise printed onto the metal foil, it has generally been found that greater line accuracy and complexity of pattern are enabled by the use of photosensitive resist techniques. In such techniques, the photoresist material is completely coated over the entire surface of the foil, the negative placed thereon and the assembly exposed. After developing, the resist pattern of clear definition remains. For some applications, it may be desirable to utilize a combination of a base resist material of very high acid resistance and a superposed photosensitive resist material for speeding the rate of exposure. Generally, the resist material is utilized in a thickness of 0.1 to 1.0 mil with a thickness of 0.2 to 0.6 mil being suitable for most applications. A specific example of a satisfactory resist material is the Eastman Kodak product known as KMER (Kodak Metal Etch Resist) and a suitable auxiliary photosensitive resist material for increasing the exposure speed is the Eastman Kodak product known as KPR (Kodak Photo Resist).

The circuit component may have a planar surface provided by introducing synthetic plastic into the etched-out portions of the foil to act as a flushing agent, although for some applicaions the discontinuous surface is desirable. When synthetic plastic backing material is employed, the plastic can be only partially cured prior to etching and then the etched panel can be subjected to sufficient heat and pressure to cause the synthetic plastic to flow into the etched-out portions to provide the flushing agent. Alternatively, an interlayer of a synthetic plastic adhesive of sufficient thickness may be provided so that, upon subjection of the panel to heat and pressure after the etching operation, a portion of the synthetic plastic adhesive will flow into the etched-out portions of the foil to act as the flushing agent.

Generally, however, it has been most convenient to utilize a separate flushing agent of synthetic plastic material which may be subject to heat and pressure sufficient to cause it to flow into the etched-out portions of the foil and cure therein. Although thermoplastic resins may be employed for this purpose, thermosetting resins are preferable for optimum characteristics of thermal resistance, dielectric properties and strength. Among the synthetic plastics which may be employed are epoxides, melamine-aldehydes and nitrile-phenolics.

It has been found that a solid bubble- and gas-free flushing agent may be reliably and easily provided by use of a partially cured thermosetting resin which is a solid at room temperature and pressure. Pellets or granules of solid resin are placed upon the etched surface of the foil and then heat and pressure are applied in a suitable press to cause the partially cured resin to flow into the etched-out portions and provide a gas-free and bubble-free filler or flushing agent. A B-staged resin system produced by epichlorohydrin-bis-phenol-A-type resin and an aromatic amine hardener has proven particularly effective for this procedure.

After the panel has been etched, the acid and salts are washed off the surface with water, ammonia, or other suitable liquid. The resist material is then removed, either by immersion in a specific solvent bath or by abrasion. A satisfactory solvent for most photoresist materials is a bath containing 3 parts trichloroethylene and 1 part methylene chloride.

After flushing, the surface of the panel is machined to remove excess synthetic plastic. The final step is to polish the surface to the desired degree of uniformity.

Referring now to FIGS. 1 and 2 of the attached drawing, a commutator of the type which may be produced in accordance with the present invention is therein illustrated. As shown, a plurality of conductive and concentric metal rings 2 of noble metal alloy provide an electrically conductive pattern and are separated from each other by synthetic plastic flushing agent 4 which is coplanar with the surface of the conductive rings 2. A peripheral non-conducting portion 6 is also provided by synthetic plastic flushing agent and is coplanar with the conductive rings 2 and flushing agent 4. As seen in FIG. 2, the conductive metal rings 2 are bonded to a synthetic plastic backing member 8 by an intermediate adhesive layer 10. The flushing agent 4 and non-conducting portion 6 are bonded to the adhesive layer 10 and thereby to the backing 8 and provide a void-free panel.

In operative assembly diagrammatically illustrated in FIG. 2, the commutator cooperates with a brush assembly 12 comprised of six contacts 14 mounted in the block 16 so that upon relative rotation between the brush assembly 12 and commutator, electrical connection is made intermittently between adjacent conductive rings 2.

Figure 3:
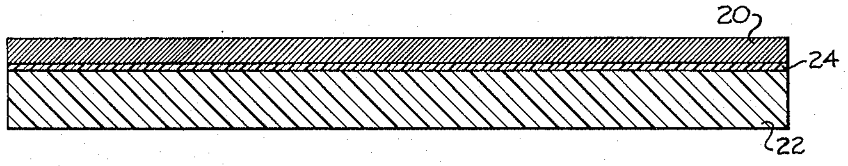
FIG. 3 is a transverse section of a foil-plastic laminate used in the production of the commutator of FIG. 1.
Figure 4:
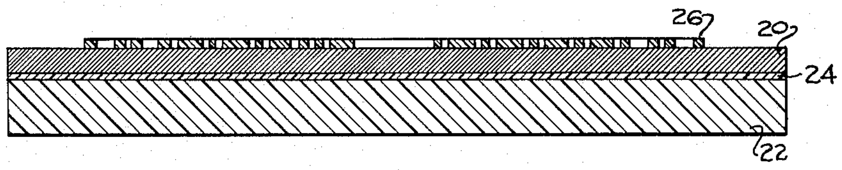
FIG. 4 is a similar view after the resist pattern has been provided upon the surface of the wrought metal foil.
Figure 5:
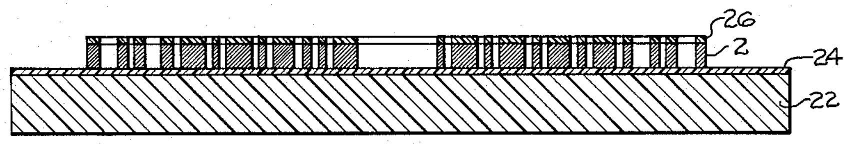
FIG. 5 is a similar view showing the laminate after the etching operation.

Referring now to FIGS. 3–5 of the drawing, the panel is shown at various steps in the production of the commutator of FIGS. 1 and 2. In FIG. 3, there is illustrated a typical laminate provided by bonding the wrought noble metal foil 20 to a synthetic plastic backing member 22 by an intermediate layer of a synthetic plastic adhesive 24. In FIG. 4, the desired resist pattern 26 has been provided upon the surface of the metal foil 20 by photoprinting, silk-screening or other suitable technique.

In FIG. 5, the panel has been etched to provide the desired concentric conducting rings 2. As shown, the metal has been etched completely away between the resist material, but the adhesive 10 desirably remains unaffected by the bath. Subsequently, the resist material 26 is removed and the flushing agent 4 and the peripheral flushing material 6 is applied to provide the finished component of FIGS. 1 and 2.

As will be readily appreciated, double-sided circuit components, i.e., those having two distinct conductive patterns, may be readily prepared by bonding noble metal foils to both sides of a backing member. The same or varying patterns of resist material may be provided upon the two foils and then they may be etched simultaneously in the acid bath. The two surfaces may subsequently be flushed with synthetic plastic material simultaneously. Alternatively, two distinct foil backing laminates or panels may be bonded together back to back although such technique requires the handling and treatment of two separate pieces.

Exemplary of the efficacy of the present invention are the following specific examples.

*Example 1*

The commutator which is illustrated at twice actual size in FIG. 1 of the attached drawings was produced in the following fashion.

To a sheet of glass-filled epoxy backing material 1/16 inch in thickness was applied a preformed film of nitrile-phenolic adhesive 6 mils in thickness, and superposed upon this was a noble metal foil 3 mils in thickness. The noble metal foil was composed of an alloy containing 71.5 percent by weight gold, 8.5 percent by weight platinum, 4.5 percent by weight silver, 14.5 percent by weight copper and 1.0 percent by weight zinc and had been age-hardened at about 875° Fahrenheit. This laminating assembly was then placed in a platen press and maintained at about 1000 p.s.i. and 300° Fahrenheit for approximately one hour.

The resultant laminate was then coated with an organic acid-resistant polymer (Eastman Kodak KMER) to a thickness of about 0.3 mil and thereafter a coating of a highly photosensitive resist material (Eastman Kodak KPR) was superposed in a thickness of about 0.1 mil. A negative defining the resist pattern was placed thereon and, after exposure, the coated laminate was developed so as to remove the resist material in the unexposed areas.

This coated laminate was then immersed in an acid bath composed of 5 mols per liter of hydrochloric acid and 4.3 mols per liter of nitric acid which was maintained at a temperature of about 41° centigrade. After the acid had etched through the unprotected alloy (a period of approximately four minutes), the laminate was removed from the etching bath and rinsed in water to remove the residual acid and salts. The resist material was then stripped in a solvent bath composed of 1 part methylene chloride and 3 parts of trichloroethylene.

A partially cured or B-staged resin system was prepared from an epichlorohydrin-bis-phenol-A-type resin and an aromatic amine-type hardener. Solid pellets or granules of this B-staged resin system were placed upon the etched surface of the foil laminate between pressure plates. The assembly was then subjected to a pressure of approximately 1000 p.s.i. at a temperature of about 300° Fahrenheit for one hour which caused the resin to flow into the etched-out portions of the foil and to cure therein. The surplus plastic was then machined off the surface of the laminate and the working surface of the laminate was polished to the desired uniformity of surface for its performance as a circuit component.

The commutators thus produced have been found to exhibit excellent peel strength, corrosion resistance, hardness and superior electrical performance with a minimum of electrical noise.

*Example 2*

A double-sided switching unit having patterns of ring segments upon both sides of the circuit component was prepared similarly to the commutator of Example 1. Foils of the noble metal alloy of Example 1 and each 3 mils in thickness were bonded to opposite sides of a glass-filled epoxy sheet about 1/16 inch in thickness by nitrile-phenolic adhesive films about 6 mils in thickness by a procedure similar to that employed in Example 1.

Coatings of acid resist and photosensitive resist were developed to provide mirror-image patterns on the two foil surfaces. The panel was then immersed in a bath containing about 5.0 mols of hydrochloric acid and 4.3 mols of nitric acid at a temperature of about 40° centigrade for about four minutes until the unprotected metal was etched through.

The acid and salts were rinsed off in water and the resist material was stripped in a bath of methylene chloride and trichloroethylene. No flushing agent was required or utilized for these particular circuit components.

*Example 3*

Contact blades were similarly produced from foil 5 mils in thickness of the alloy in Example 1. The foil was coated upon both sides with acid resist and upon one side with a superposed layer of photosensitive resist. The photosensitive resist was exposed to the negative pattern and developed.

The foil was then immersed in an acid bath formulated in accordance with Example 1 for a period of about six minutes to remove the unprotected metal foil. Subsequently the foil was rinsed in water and the resist material stripped in the solvent bath.

The resultant contact blades were then tumbled lightly to polish the surface.

As can be seen from the foregoing detailed description and specific examples, the present invention provides a circuit component having a conductive pattern of wrought noble metal alloy. The pattern is thus provided by metal of excellent corrosion resistance, hardness and homogeneity which is essentially free from contamination and inclusions. By the present invention, noble metal conductive patterns of relatively great thickness and complexity may be readily provided and the surface may be readily machined or polished for optimum uniformity.

As will be apparent to those skilled in the art, modifications may be made without departing from the spirit of the invention which has been illustrated by the foregoing specification and examples.

What is claimed is:

1. In the method of making electrical components of noble metal, the steps comprising: providing a wrought metal foil of about 1 to 10 mils thickness formed from an alloy containing essentially 60.0 to 75.0 percent by weight gold, 5.0 to 15.0 percent by weight of second noble metal component selected from the group consisting of platinum and palladium and platinum, said second noble metal component providing at least 3.0 percent by weight platinum, 10.0 to 20.0 percent by weight copper, up to 10.0 percent by weight silver and up to 3.0 percent by weight zinc; forming a resist pattern on a surface of said foil from an organic material resistant to attack by a bath of concentrated nitric and hydrochloric acids; and immersing said foil in a bath containing 2.8 to 5.8 mols per liter of nitric acid and 3.5 to 6.5 mols per liter of hydrochloric acid at a temperature of about 20 to 80° centigrade for a period of time sufficient to etch the foil unprotected by said resist pattern.

2. The method in accordance with claim 1 wherein said alloy contains essentially 70.0 to 73.0 percent by weight gold, 3.0 to 8.0 percent by weight silver, 7.0 to 10.0 percent by weight platinum, 13.0 to 16.0 percent by weight copper and up to 2.0 percent by weight zinc.

3. The method in accordance with claim 1 wherein said bath contains 4.5 to 5.5 mols per liter of hydrochloric acid and 3.8 to 4.8 mols per liter of nitric acid at a temperature of about 35 to 55° centigrade wherein the temperature of said etching bath is maintained at about the first peak in the reaction rate-temperature curve.

4. The method in accordance with claim 1 wherein said bath contains about 5.0 mols per liter of hydrochloric acid and 4.3 mols per liter of nitric acid and is at a temperature of about 39 to 42° centigrade.

5. The method in accordance with claim 1 wherein a partially cured thermoseting resin powder is placed on the foil and heat and pressure is applied to cause the synthetic plastic to flow into the etched-out portions of the foil and to cure the resin and produce a smooth gas- and bubble-free filling of synthetic plastic in the etched-out portions.

6. In the method of making a circuit component having an electrically conductive pattern of noble metal therein, the steps comprising: providing a wrought metal foil of about 1 to 10 mils thickness formed from an alloy containing essentially 70.0 to 73.0 percent by weight gold, 7.0 to 10.0 percent by weight of second noble metal component selected from the group consisting of platinum and palladium and platinum, said second component providing at least 3.0 percent by weight platinum, 13.0 to 16.0 percent by weight copper, 3.0 to 8.0 percent by weight silver and up to 2.0 percent by weight zinc; securing said foil to a backing member of a material selected from the group consisting of metal and synthetic plastic by means of an adhesive; forming a resist pattern on the outer surface of said foil from an organic material resistant to attack by a bath of concentrated nitric and hydrochloric acids; immersing said foil in a bath containing 4.5 to 5.5 mols per liter of hydrochloric acid and 3.8 to 4.8 mols per liter of nitric acid at a temperature of about 35 to 55° centigrade for a period of time sufficient to etch the alloy unprotected by said resist pattern; and thereafter depositing a synthetic plastic material in the etched portions of said foil to provide a substantially uniform surface.

7. The method in accordance with claim 6 wherein said bath contains about 5.0 mols per liter of hydrochloric acid and about 4.3 mols per liter of nitric acid and is maintained at a temperature of about 39 to 42° centigrade and wherein the temperature of said etching bath is maintained at about the first peak in the reaction rate-temperature curve.

References Cited in the file of this patent

UNITED STATES PATENTS

| | | |
|---|---|---|
| 2,602,731 | Nierenberg | July 8, 1952 |
| 2,626,206 | Adler et al. | Jan. 20, 1953 |
| 2,864,730 | Kinder et al. | Dec. 16, 1958 |
| 2,997,521 | Dahlgren | Aug. 22, 1961 |
| 2,998,475 | Grimsinger | Aug. 29, 1961 |
| 3,010,863 | Coe et al. | Nov. 28, 1961 |